United States Patent
Hübner

(10) Patent No.: US 6,915,945 B2
(45) Date of Patent: Jul. 12, 2005

(54) METHOD FOR CONTACT-CONNECTING AN ELECTRICAL COMPONENT TO A SUBSTRATE HAVING A CONDUCTOR STRUCTURE

(75) Inventor: Holger Hübner, Baldham (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/718,775

(22) Filed: Nov. 21, 2003

(65) Prior Publication Data

US 2004/0099366 A1 May 27, 2004

Related U.S. Application Data

(63) Continuation of application No. PCT/DE02/01254, filed on Apr. 5, 2002.

(30) Foreign Application Priority Data

May 21, 2001 (DE) .......................................... 101 24 770

(51) Int. Cl.[7] .......................... B23K 31/02; B32B 31/00
(52) U.S. Cl. ............... 228/228; 228/180.1; 228/180.22; 156/155; 156/196; 156/297
(58) Field of Search .......................... 228/173.1, 173.2, 228/180.1, 228; 156/155, 196, 297

(56) References Cited

U.S. PATENT DOCUMENTS

| | | | |
|---|---|---|---|
| 3,501,832 A | * | 3/1970 | Saburo et al. ................. 29/840 |
| 4,972,988 A | | 11/1990 | Ohdate |
| 5,305,944 A | | 4/1994 | Yoshida et al. |
| 5,714,252 A | * | 2/1998 | Hogerton et al. ............ 428/344 |
| 5,998,861 A | * | 12/1999 | Hiruta ......................... 257/700 |
| 6,063,649 A | * | 5/2000 | Yoshino ...................... 438/118 |
| 6,449,836 B1 | * | 9/2002 | Miyake et al. ................. 29/830 |
| 6,478,906 B1 | | 11/2002 | Azdasht et al. |

FOREIGN PATENT DOCUMENTS

| | | |
|---|---|---|
| DE | 37 40 773 A1 | 6/1989 |
| DE | 40 23 516 C2 | 2/1991 |
| DE | 195 04 967 A1 | 8/1996 |
| EP | 0 694 871 A1 | 1/1996 |
| EP | 0694871 A1 * | 1/1996 |
| EP | 0 758 145 A2 | 2/1997 |
| EP | 0 907 205 A2 | 4/1999 |
| FR | 2 754 619 A1 | 4/1998 |
| FR | 2 780 534 A1 | 12/1999 |
| FR | 2780534 A1 * | 12/1999 |

OTHER PUBLICATIONS

Morris, J. W. et al.: "Microstructure and Mechanical Properties of Sn–In and Sn–Bi Solders", JOM, Minerals Metals and Materials Society, vol. 45, No. 7, Jul. 1993, pp. 25–27.

* cited by examiner

*Primary Examiner*—Lynne R. Edmondson
(74) *Attorney, Agent, or Firm*—Laurence A. Greenberg; Werner H. Stemer; Ralph E. Locher

(57) ABSTRACT

For the purpose of contact-connecting an electrical component, in particular a semiconductor component, on a substrate having a conductor structure, a joining temperature is chosen in such a way that the substrate, with a pressure being exerted on the electrical component, experiences a plastic deformation, with the result that the electrical component is pressed together with the conductor structure into the substrate in a positively locking manner. In order to produce the connection between the component and the substrate, use is preferably made of a thin diffusion solder layer which can be processed at temperatures lying below the melting point of the substrate.

14 Claims, 1 Drawing Sheet

METHOD FOR CONTACT-CONNECTING AN ELECTRICAL COMPONENT TO A SUBSTRATE HAVING A CONDUCTOR STRUCTURE

CROSS-REFERENCE TO RELATED APPLICATION

This application is a continuation of copending International Application No. PCT/DE02/01254, filed Apr. 5, 2002, which designated the United States and was not published in English.

BACKGROUND OF THE INVENTION

FIELD OF THE INVENTION

When contact-connecting electrical components, in particular semiconductor components (chips), on substrates, use is usually made of relatively expensive substrate materials, such as, for example, flexible sheet carriers made of plastic, and expensive electrically conductive adhesives. However, many adhesives of this type already require, for curing, relatively high temperatures at which the plastic material of the sheet carrier is damaged or a metallization layer applied thereon is stripped off.

It should be endeavored to use inexpensive soldering methods for contact-connecting the component on the substrate since these methods are more cost-effective relative to the electrically conductive adhesives. However, on account of their high joining temperatures, soldering methods require particularly temperature-resistant and hence expensive substrate materials.

A further difficulty arises if the surface of the substrate onto which the electrical component is intended to be contact-connected has unevennesses that exceed the height of the solder layer. Particularly when the solder layer is not only intended to ensure the mechanical fixing of the component but also serves for the production of electrically conductive contacts, the liquid solder phase can no longer completely fill the volume of the cavities below the component with the result that open electrical contacts can occur. In conventional contact-connection methods using conductive adhesives or solder balls (solder bumps) that have a height of 30 to 100 $\mu$m, unevennesses in the region of a few $\mu$m are effortlessly compensated for. When thin solder layers are used, the above-mentioned problems can arise.

SUMMARY OF THE INVENTION

It is accordingly an object of the invention to provide a method for contact-connecting an electrical component to a substrate having a conductor structure that overcomes the above-mentioned disadvantages of the prior art methods of this general type, which yields a permanent electrically conductive connection of sufficient conductivity in the case of an uneven surface of the substrate independently of the thickness of a bonding agent.

With the foregoing and other objects in view there is provided, in accordance with the invention, a method for contact-connecting an electrical component on a substrate having a conductor structure. The method includes introducing a bonding agent between the electrical component and the conductor structure of the substrate. The bonding agent has a melting point being at a temperature at which the substrate is not damaged. A permanent electrically conductive connection is produced by melting the bonding agent and the bonding agent subsequently solidifying. This is performed by the steps of increasing a joining temperature above a glass transition temperature of the substrate, and exerting a pressure on the electrical component resulting in the substrate experiencing a plastic deformation and the electrical component being pressed together with the conductor structure into the substrate in a positively locking manner. The bonding agent is brought to solidification before the plastic deformation of the substrate takes place.

In the method according to the invention, a bonding agent, preferably a metallic solder material containing at least two metallic or semiconducting chemical elements, is introduced between the electrical component and the conductor structure of the substrate. The solder material is configured in such a way that it has a melting point which lies below a critical temperature for the resistiveness of the substrate. The joining temperature during the contact-connection is chosen in such a way that the substrate, with a pressure being exerted on the electrical component, experiences a plastic deformation, with the result that the component is pressed together with the conductor structure into the substrate in a positively locking manner.

According to the invention, the joining temperature is deliberately increased above the glass transition temperature of the substrate, with the result that the component can be pressed into the substrate until the unevennesses of the substrate surface are compensated for. Since at least parts of the conductor structure that are located below the component are concomitantly pressed into the substrate during this operation, the conductor structure must be elastic such that it does not break or tear. On account of the only small unevennesses of the surface of the substrate, the customary conductor tracks made of copper or nickel are sufficiently expandable or compressible.

In the method according to the invention, use is preferably made of a substrate made of a soft material that has a melting point below 120° C. The material may be composed, for example, of PVC (polyvinyl chloride), PET or the like. Substrates made of this material are very soft, have a low melting point and, moreover, are highly cost-effective.

The method according to the invention can be used to connect an electrical component purely mechanically to the substrate or to contact-connect electrical contacts of the component directly to corresponding contact points, which are part of the conductor structure on the substrate, for the purpose of producing an electrically conductive connection.

In the first-mentioned alternative, an electrically conductive connection could be produced by bonding wires, for example. The term contact-connection should then be understood to mean that a mechanical connection between component and substrate that is uniform and thus secure against stripping-off is ensured over the entire connecting area of the component.

In the latter case, the bonding agent is introduced between a contact of the electrical component and the corresponding contact points of the conductor track. The parameters of the method are preferably chosen in such a way that the bonding agent is made to solidify before the plastic deformation of the substrate commences. This procedure has the advantage that lateral material movements of the substrate during the elastic deformation can no longer shift the position of the contact points. Such a shift could, if appropriate, impair the electrically conductive connection between the component and the substrate either by virtue of no connection being produced or by virtue of a connection between non-desired conductors being affected. If the lateral material movements of the substrate were not limited, the spacings of the contact points and conductor tracks would have to be increased. However, this would entail a larger area requirement.

A solder material made of at least two elementary metals or semiconductor materials is preferably used as the bonding agent. The molten solder material is preferably configured in such a way that it enters into an alloy or intermetallic compound or phase with the metal of the metal layer of the sheet or with the metal of the contact of the semiconductor component. Preferably, the melting point is so high that, in the event of an attempt to melt the solder connection, the sheet would inevitably be damaged or at the very least the metal layer would be stripped from the sheet and the entire configuration would thus become unusable.

A solder material which is particularly suitable for this is a composition—i.e. a mixture containing at least and preferably two components which form a mixture, an alloy or a stoichiometric compound—whose proportions are chosen in such a way that the composition lies at a eutectic point or at least in the vicinity of a eutectic point. This is because, for this choice of composition, it holds true that the melting point of the composition increases each time the proportions of the components change. When the solder material is melted, an alloy or an intermetallic compound is produced which contains a proportion of the metal of the metal layer of the sheet or of the contact of the semiconductor component, with the result that the composition of the material forming the electrically conductive connection differs from the eutectic of the original composition of the solder material to such a significant extent that the melting point is considerably higher, in particular above the temperatures safe for the sheet. In this case, the term approximately eutectic composition shall define a composition having a melting point which differs from the temperature of the eutectic at most by 10° C.

What is appropriate as a possible solder material, preferably in conjunction with a metal layer of a sheet made of copper or nickel, is primarily a material containing bismuth (chemical symbol Bi). Eutectic or approximately eutectic (temperature difference with respect to the eutectic at most 10° C.) compositions which achieve what is desired are materials from the group of a composition containing bismuth and indium, a composition containing bismuth and tin and a composition containing indium and tin.

As an alternative, a thermoplastic adhesive that solidifies before the plastic deformation of the substrate commences could also be used. The use of a thermoplastic adhesive additionally ensures sealing of the contact points.

In order to heat the configuration containing the component and the substrate, a laser operating in the infrared region or a laser having a wavelength of <1 μm is appropriate. The laser operated in the infrared region heats the metallic elements from that side of the substrate that is remote from the component, whereby the solder material is made to melt. The solder material solidifies after the laser has been switched off. The heat stored in the metal suffices, however, to heat the adjacent substrate, whereby the latter can be plastically deformed. The electrical component is heated by the laser operated with a wavelength of <1 μm. Given sufficiently long irradiation, the solder material is first made to melt. The solder material solidifies after the laser has been switched off, the heat stored in the component heating the adjacent substrate material to a sufficient extent to bring about the plastic deformation of the substrate with a pressure being exerted on the component.

Other features which are considered as characteristic for the invention are set forth in the appended claims.

Although the invention is illustrated and described herein as embodied in a method for contact-connecting an electrical component to a substrate having a conductor structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
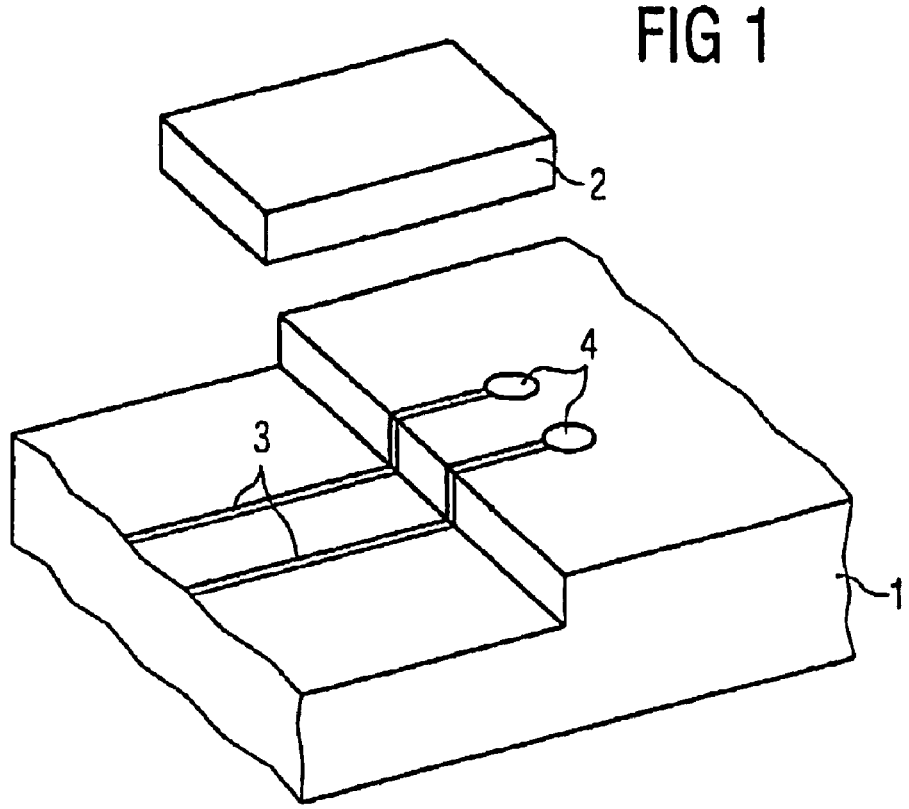
FIG. 1 is a diagrammatic, perspective view of a component and an uneven substrate before a contact-connection.

Referring now to the figures of the drawing in detail and first, particularly, to FIG. 1 thereof, there is shown an electrical component 2 positioned above a substrate 1. A conductor structure with conductor tracks 3 and contact points 4 is situated on a surface of the substrate 1 which faces the component 2. In an exemplary fashion, only two conductor tracks with a respective contact point are illustrated in the example. It cannot be seen from the perspective view that the component 2 has two corresponding contacts on its main side facing the substrate 1.

The surface of the substrate 1 which faces the component 2 has an unevenness in the form of an exemplary step. For reasons of clarity, the step is illustrated in an exaggerated raised manner and, in reality, will be significantly less pronounced. Moreover, the step need not—in contrast to the present illustration—be formed at right angles to the surface of the substrate.

As can be seen from FIG. 1, in the case of conventional contact-connection, a part of the component 2 would be situated on the upper part of the step, while the other region would project beyond the step. If a solder material which is thicker than the height of the step is used, the height difference can readily be compensated for. However, if a bonding agent which is thinner than the height of the step is used, in the absence of further measures an unstable configuration results through which the component itself could be impaired by mechanical stresses or the electrically conductive connection between the contact points 4 and the corresponding contacts of the component 2 could be impaired.

Figure 2:
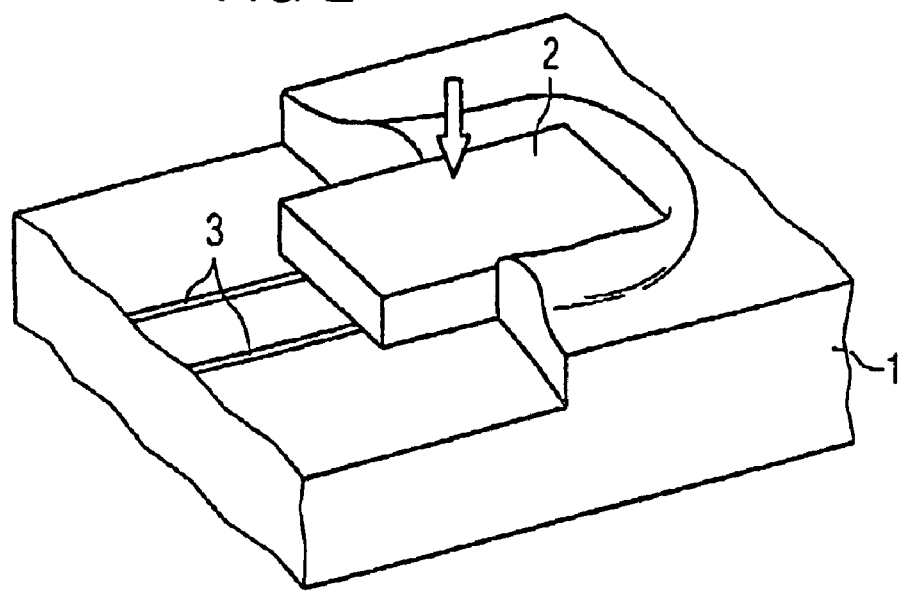
FIG. 2 is a perspective view of the component that has been contact-connected onto an uneven substrate according to the invention.

According to the invention, for the purpose of contact-connection, first the solder material is applied to the contact points of the substrate 1 and/or to the contacts of the component 2. Afterwards, the component 2 is brought into contact with the surface of the substrate, a pressure is exerted on the component and the configuration is then heated. The heating can be affected using a laser, for example. When a solder material having a low melting point is used, such as e.g. a BiIn alloy, an InSn eutectic or an intermetallic phase (for example BiIn), the solder melts and solidifies before the substrate has been heated to an extent such that it melts. Only after the solidification of the solder material does the plastic deformation of the substrate commence, whereby the component is pressed together with the conductor tracks 3 located underneath into the substrate in a positively locking manner. The result is illustrated in FIG. 2.

I claim:

1. A method for contact-connecting an electrical component on a substrate having a conductor structure, which comprises the steps of:

introducing a bonding agent between the electrical component and the conductor structure of the substrate, the bonding agent having a melting point being at a temperature at which the substrate is not damaged; and producing a permanent electrically conductive connection by the steps of:

melting the bonding agent by heating the bonding agent to the melting point;

bringing the bonding agent to solidification;

increasing a joining temperature above a glass transition temperature of the substrate without causing the bonding agent to remelt; and exerting a pressure on the electrical component resulting in the substrate experiencing a plastic deformation and the electrical component being pressed together with the conductor structure into the substrate in a positively locking manner, and the bonding agent being brought to solidification to form a rigid electric contact before the plastic deformation of the substrate takes place.

2. The method according to claim 1, which further comprises:

forming the conductor structure with at least one conductor track and at least one contact point; and introducing the bonding agent between a contact of the electrical component and the contact point of the conductor track.

3. The method according to claim 1, which further comprises forming the substrate from a soft material having a melting point below 120° C.

4. The method according to claim 3, which further comprises forming the substrate from a material selected from the group consisting of PVC and PET.

5. The method according to claim 1, which further comprises forming the bonding agent from a solder material made of at least two different elementary metals or semiconductor materials.

6. The method according to claim 5, which further comprises forming the solder material from bismuth.

7. The method according to claim 5, which further comprises forming the solder material from a composition containing bismuth and indium, a composition containing bismuth and tin, or a composition containing indium and tin.

8. The method according to claim 7, which further comprises forming the solder material from an intermetallic compound, a phase of a composition of BiIn, or a phase of a composition of $BiIn_2$.

9. The method according to claim 1, which further comprises using a thermoplastic adhesive as the bonding agent.

10. The method according to claim 1, which further comprises heating the electrical component and the substrate with a laser operating in an infrared region, which acts through the substrate in a direction of the electrical component.

11. The method according to claim 1, which further comprises providing a semiconductor component as the electrical component.

12. A method for contact-connecting an electrical component on a substrate having a conductor structure, which comprises the steps of:

introducing a bonding agent between the electrical component and the conductor structure of the substrate, the bonding agent having a melting point being at a temperature at which the substrate is not damaged;

heating the electrical component, the substrate and the bonding agent to a joining temperature above a glass transition temperature of the substrate for melting the bonding agent;

bringing the bonding agent to solidification; and exerting a pressure on the electrical component, diffusing heat to the substrate from at least the bonding agent resulting in the substrate experiencing a plastic deformation and the electrical component being pressed together with the conductor structure into the substrate in a positively locking manner for forming a permanent electrical conductive connection, the bonding agent remaining in a solid state during the diffusion of the heat.

13. The method according to claim 1, wherein the bonding agent is a solder material, the melting point of which increases during the soldering process.

14. The method according to claim 1, wherein the bonding agent is a thermoplastic adhesive that solidifies before the plastic deformation of the substrate.

* * * * *